United States Patent [19]
Strahm

[11] Patent Number: 4,979,218
[45] Date of Patent: Dec. 18, 1990

[54] BALANCED OUTPUT CIRCUIT

[75] Inventor: Chris N. Strahm, Portland, Oreg.

[73] Assignee: Audio Teknology Incorporated, Durham, Oreg.

[21] Appl. No.: 345,486

[22] Filed: May 1, 1989

[51] Int. Cl.$^5$ .............................................. H04B 15/00
[52] U.S. Cl. ...................................... 381/94; 330/258; 381/121
[58] Field of Search ................. 330/258; 307/490, 491, 307/494; 381/120, 121, 94

[56] References Cited

U.S. PATENT DOCUMENTS

| | | | |
|---|---|---|---|
| 3,582,802 | 6/1971 | Weekes et al. | 330/258 |
| 3,705,365 | 12/1972 | Szabo et al. | 330/258 |
| 3,845,404 | 10/1974 | Trilling | 330/258 |
| 4,352,998 | 10/1982 | Baker et al. | 330/258 |
| 4,393,347 | 7/1983 | Looper | 330/258 |
| 4,752,744 | 6/1988 | Aoki | 330/258 |
| 4,794,349 | 12/1988 | Senderowicz et al. | 330/258 |
| 4,833,418 | 5/1989 | Quintus et al. | 330/258 |

*Primary Examiner*—Forester W. Isen
*Attorney, Agent, or Firm*—Robert K. Tendler

[57] ABSTRACT

An electronic output transformer permits elimination of hum and other ground loop interference from audio signals transmitted between separated pieces of equipment. The transformer has a balanced differential output and feedback circuits which force the differential output voltage to equal the input voltage, and which force the current in the balanced output lines to be precisely equal and out-of-phase. This permits hum and extraneous signal rejection at the input of the remotely located piece of equipment and results in common mode rejection ratios in excess of 100 db.

11 Claims, 2 Drawing Sheets

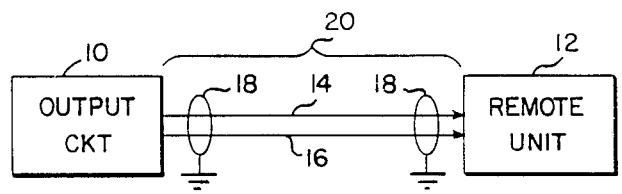
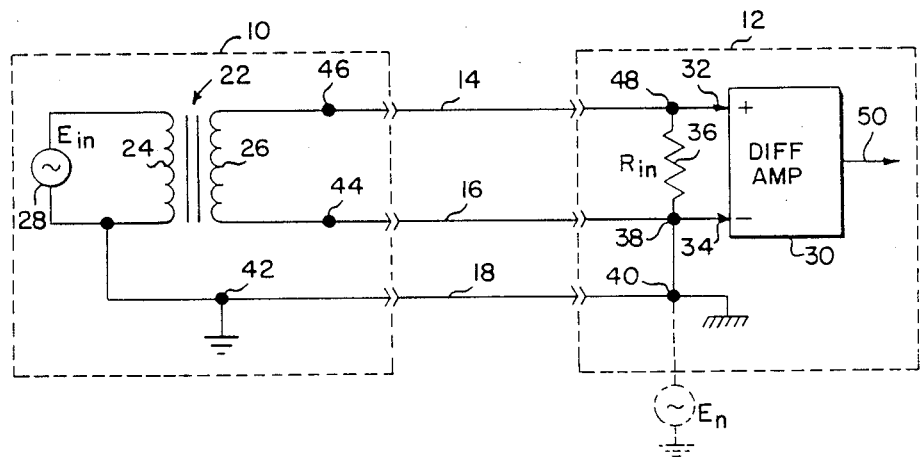

BALANCED OUTPUT CIRCUIT

FIELD OF THE INVENTION

This invention relates to a method and apparatus for Providing very high common mode rejection of extraneous signals introduced between balanced output lines and ground; and, more particularly, to an electronic transformer which includes a balanced output circuit that provides common mode rejection ratios exceeding those associated with output transformers.

BACKGROUND OF THE INVENTION

Balanced output circuits are commonly used in communications and audio equipment to facilitate the connection of audio frequency signals between separated devices or equipment to reduce or eliminate unwanted effects of hum, interference, and noise introduced into the system by conduction through grounding or radiated fields. In the normal process of connecting different system components in an audio frequency system, potential differences in ground voltages at the location of the different system components often occur. These unwanted hum and noise signals present in the power grounding circuits will be added into the desired signal unless some means are provided to reject the common mode ground noise. Traditionally, the most reliable means of achieving this has been to add output transformers to the coupled signals to break the path through ground and isolate the pure signal from the differences in ground potential. However, transformers have three principal qualities which are undesirable. These qualities include relatively high cost, large physical size and high weight. It is therefore highly desirable to utilize an electronic circuit having low cost, small size and low weight which is capable of performing the function of a transformer in rejecting common mode ground noise.

How common mode ground noise is rejected with a so-called perfect output transformer is as follows in a worst case scenario in which hum is directly coupled onto one of the balanced transmission lines. Considering a piece of audio equipment with a balanced output being supplied over balanced lines to the unbalanced input of a remotely located unit, assuming that the noise signal is introduced within the ground loop, the voltage associated with the noise signal is directly coupled to one of the transmission lines and is reflected back from the remote unit over the grounded transmission line to one end of the secondary winding of the output transformer. Assuming a perfect transformer with infinite isolation to the local common, and zero impedance in the secondary, then this hum voltage will appear on the ungrounded transmission line and there will be exactly equal in-phase voltages on each of the lines. Assuming a differential amplifier at the unbalanced input, with an ideal output transformer, the voltage represented by the hum or unwanted signal is equal in magnitude and equal in-phase at the differential amplifier such that the hum or other extraneous signals are completely cancelled. This is because equal voltages simultaneously appear on its inverting and non-inverting input terminals. The same would be true in a balanced input situation.

If the balanced system can be characterized as equivalent to an input transformer, equal in-phase noise at the primary is not transmitted to the secondary and thus is not reflected in the output. The same can be said for a balanced electronic input stage, with the only difference over the unbalanced case being the amount of noise coupled to the balanced transmission line. Note, with a balanced line, the audio signal to be transmitted results in opposite polarity signals at both inputs to the remote unit.

The ground hum or noise voltage is referred to as the common mode signal and the amount of rejection by which the common mode signal will be attenuated is the common mode rejection ratio, CMR.

In theory, for a perfect isolation transformer, the CMR would be infinite. However, in practice, it is not because of the inability of the transformer to be constructed with a zero resistance secondary and due to the finite impedances that exist in the transmission cable and the input to the differential amplifier.

In the past, there have been several attempts to emulate the characteristics of a perfect output transformer. One such circuit utilizes a simple differential output circuit that provides both non-inverted and inverted output signals of opposite phase. This circuit is typically comprised of two high gain amplifiers, one of which having a non-inverted output and the other of which having an inverted output. While this circuit does provide two out-of-phase signal outputs, and thus can be characterized as providing a balanced output, the output is not floating with respect to common. While the circuit is balanced, it does not reject any ground hum whatsoever. Moreover, it has the obvious short circuit problem when one of the output lines is tied to ground as is the case when such a balanced circuit drives an unbalanced input.

In order to provide a circuit which has some ability to reject hum, in the past, a circuit has been provided with two high gain amplifiers and a network of resistors that enable cross-feedback between the two outputs. This circuit does provide two out-of-phase signal outputs and can therefore be characterized as balanced. It also provides a transformer-like effect and can be considered floating, assuming the resistors are of equal value. Even with equal-valued resistors, what this circuit fails to take into account is that it requires output resistors in the output circuits of each of the differential amplifiers. This means that the output voltages downstream of the output resistors are of different magnitudes. The reason is that the resistor associated with the output of one of the differential amplifiers is loaded by a resistor string that feeds the other differential amplifier along with the load impedance. Thus, even with theoretically perfect resistors, the abovementioned circuit has only about 30db of CMR. While the abovementioned circuit does provide somewhat of a floating output, it is clearly not capable of achieving very high CMRs even when built from perfect components.

Additionally, this circuit has several stability problems associated with the cross-coupled circuit due to the fact that a positive feedback gain of almost one exists around the loop. As a result, unwanted DC offsets exist, and latch up can occur. Also, in the unloaded condition, the amplitudes from the two balanced outputs are never equal. Moreover, the system sometimes oscillates and has poor clipping behavior. It will be appreciated that there is no way of solving these problems in the above circuit because the circuit depends on positive feedback to produce the transformer floating effect. There is therefore a necessity for an electronic circuit that achieves CMRs of 100db and does not rely on positive feedback, with the circuit being both small in size and low in cost.

SUMMARY OF THE INVENTION

In order to provide an improved electronic transformer for transmitting audio signals over a balanced line from one location to an unbalanced input at a remote location, a circuit is provided requiring two high gain amplifiers and several differential summing amplifiers, with circuit operation being entirely independent of any resistor matching. The circuit is theoretically capable of achieving an infinite CMR by utilizing two feedback loops to provide the true effect of a perfect transformer. A first feedback loop forces the differential voltage produced at the output of the circuit to be equal to the input voltage. This is provided by a closed loop feedback system which samples the differential voltage at the balanced output of the circuit and compares this to the input voltage. An error voltage is then produced which, when coupled to a high gain amplifier, is self-adjusting to force the output voltage differential to match the input voltage.

While partially emulating a transformer, this, in itself, is not sufficient to define the exact voltages at each individual output. Only the differential output voltage will be controlled by this first feedback system. For a balanced output circuit to be truly capable of floating, the current from each output must be equal and out-of-phase. This is accomplished by a second negative feedback circuit. The equal, out-of-phase output current condition is a necessary condition since it is the provision of identical noise voltages on both output lines which enables noise cancellation.

In this second feedback circuit, since the output currents flowing out of the circuit cannot be interrupted, resistor shunts ar used through which the output currents are sampled. The voltages produced across these shunts are proportional to the current themselves, both in magnitude and phase. If these two voltages are out-of-phase and equal, then adding them together produces a zero result. If they are not equal and out-of-phase, then their addition will produce a non-zero resultant error voltage. This error voltage, when amplified by a high gain amplifier, is used to produce the second negative feedback system condition. If the sum of the output currents is not zero, then this feedback system corrects the two output voltages until this condition is satisfied by summing this error signal into the two outputs.

This dual feedback system architecture results in a first feedback loop which controls the differential output voltage by driving the two balanced outputs in opposite directions until the differential result matches the input signal amplitude. The second feedback loop drives both output voltages in the same direction until the output currents are equal in magnitude and out-of-phase. The result is that hum or extraneous signals result in exactly equal and in-phase voltages being applied to the input terminals of a remote device. This results either in their cancellation or in the circuitry at the remote location effectively being unresponsive to the hum such that no hum is present at the output.

Note, with these two feedback systems, one driving the outputs in opposite directions, the other driving the outputs in the same direction, the system can correctly represent any combinations of differential and common mode voltages without conflict.

Moreover, since the first feedback system is holding the output differential voltage constant, the differential output impedance is exceedingly low. This exceedingly low output impedance is that which is associated with a perfect output transformer. Also, with exactly equal voltages appearing at both outputs of the circuit, with the external signal being applied to one output, the other output is raised to the exact same voltage as well. The effective result is that the line-to-ground common mode impedance looking into the output of the circuit is extremely high. Again, this is characteristic of the so-called perfect isolation transformer.

All of the above occurs on an instantaneous real-time basis. The benefit of the above circuit is that the quality of the pseudo-transformer performance is strictly controlled by the amount of loop gain used in the two feedback systems. The more gain, the better the performance. Thus, there is no critical resistor matching that limits CMR. Also, two very stable negative feedback loops are employed rather than a overall single unstable positive feedback loop.

What has therefore been provided is electronic transformer which is a high performance balanced output device capable of driving balanced lines with true equivalent transformer balancing action while providing lower distortion and wider bandwidth than actual output transformers. The circuit provides very high common mode rejection ratios approaching and/or exceeding those of actual output transformers and maintains rejection even during clipping overloads. The rejection characteristics of the circuit can exceed, in many cases, those of actual output transformers due to the extremely low line-to-line dynamic output impedance. While practical transformers have a finite resistance between the output signal pair of between 10 and 50 ohms due to the secondary winding, the subject circuit has a balanced output impedance typically less than 0.1 ohms.

BRIEF DESCRIPTION OF THE DRAWINGS

These and other features of the subject invention will be better understood taken in conjunction with the Detailed Description and Drawings, of which:

FIG. 1 is a block diagram illustrating the transmission of audio signals from an audio output circuit to a remotely located unit;

FIG. 2 is a schematic and block diagram of the utilization of an output transformer to eliminate ground loop induced noise or extraneous signals through the utilization of a balanced line to an unbalanced input, indicating extraneous signal cancellation in a worst case scenario in which hum is directly coupled to one of the balanced lines; and, FIG. 3 is a schematic diagram and illustration of an electronic transformer which duplicates or improves on the common mode rejection associated with the isolation transformer configuration of FIG. 2.

DETAILED DESCRIPTION

Figure 3:
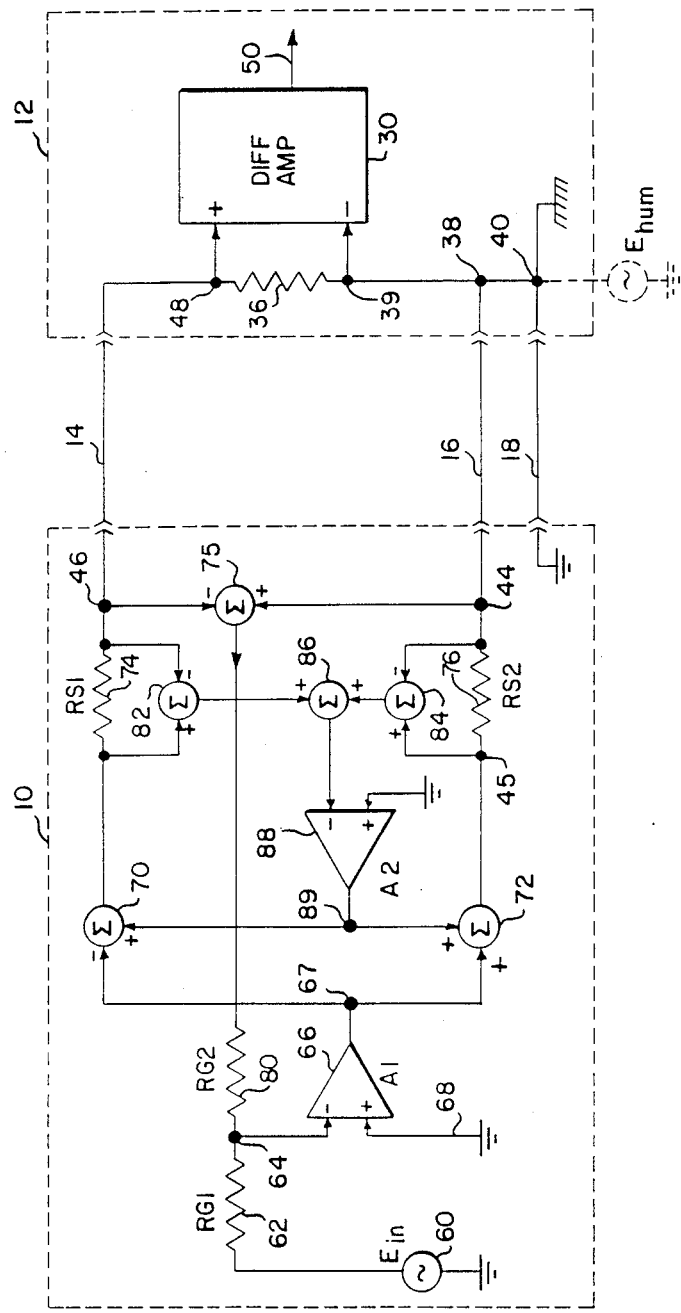

Referring now to FIG. 1, a typical audio output circuit 10 is coupled to a remote unit 12 by virtue of a balanced line involving two conductors 14 and 16 surrounded by a shield 18. It will be appreciated that the distance between the audio output circuit 10 and remote unit 12 may be as little as a few inches or as long as 200 or so feet. The transmission line is generally indicated by bracket 20. In a typical audio processing scenario, oftentimes it is necessary to transmit audio signals over long distances such as from a stage to a sound booth; or, alternatively, from one audio source to a Processing unit within a control booth. Regardless of the application, hum or other extraneous noise is frequently introduced in the ground loop which, in the past, has required either sophisticated grounding techniques or the utilization of expensive isolation transformers in order to cancel out the ground loop induced hum or extraneous noise signals. It will be appreciated that the audio source, in general, is either a microphone which has its output amplified or is any type of audio source in which audio frequency signals are to be transmitted to separated equipment such as amplifiers, graphic equalizers, special effects equipment, compressors, expanders, or other equipment for introducing time delays or enhancements of any kind. Such equipment also includes storage devices such as magnetic storage, either tape or disc. These audio signals are often run through patch bays at the control booth, with the length of run of the audio cable or snake sometimes exceeding 200 feet, as, for instance, from a stage, through the auditorium, to the control booth at the back of the hall.

Referring now to FIG. 2, and in order to cancel the extraneous noise, an isolation or output transformer 22 is provided with a primary 24 and a secondary 26, with an input signal 28 provided across primary 24. This input signal, $E_{in}$, is coupled across balanced lines 14 and 16 to the unbalanced input of unit 12 which, for illustration, is shown to include a differential amplifier 30 having non-inverting and inverting inputs, respectively 32 and 34, coupled to lines 14 and 16. The load associated with the remote unit is generally indicated by resistance 36 to be $R_{in}$. The situation depicted is a balanced transmission into an unbalanced input, with a node 38 coupled to ground as illustrated at 40. Shield 18 is also coupled to ground 40 which, to some extent, shields the audio transmission from external electrical noise.

In the operation of the isolation transformer to cancel ground loop induced hum or noise, it will be assumed that a hum or noise voltage $E_n$ exists at node 38. Assuming the magnitude of this noise voltage is one volt and assuming that a pure audio signal $E_{in}$ is supplied to transformer 22 without the addition of noise voltage $E_n$, then transformer 22 assures that the signal at differential amplifier 30 is a pure $E_{in}$ signal by providing a floating balanced output. Secondary 26 of transformer 22 is isolated from the local common of output circuit 10, namely grounded node 42.

In order to determine how much of the hum or noise voltage $E_n$ will appear in the output of differential amplifier 30, assuming $E_n$ to have a value of one volt and the ground common of output circuit 10 to be at the real ground potential of zero volts, then ground 40 of processor unit 12 is riding at the one volt of $E_n$. Since ground 40 is coupled to node 38, node 38 is also at this one volt potential. This one volt potential at node 38 is coupled to the secondary of transformer 22 at output node 44. This means that node 44 of isolation transformer 22 is at one volt.

Assuming that the transformer is a perfect transformer with infinite isolation to the local common of circuit 10, it will be appreciated that the one volt extraneous noise signal also exists at output node 46 of secondary 26, assuming zero resistance in the secondary. It will therefore be appreciated that the voltage at node 48 it the non-inverting input of differential amplifier 30 is also residing at one volt. This being the case, there is exact cancellation of the extraneous noise signal $E_n$ at the output 50 of differential amplifier 30.

In short, all ground loop induced hum or noise has been rejected by virtue of the balanced to unbalanced system utilizing the aforementioned isolation transformer. As mentioned hereinbefore, the ground hum/-noise voltage is referred to as the common mode signal and the amount of rejection by which the common mode signal will be attenuated is the common mode rejection ratio, CMRR or conveniently CMR.

The common mode rejection of the circuit of FIG. 2 would be infinite assuming that the isolation transformer is a perfect transformer constructed with wire of zero resistance and assuming infinite load resistance. Both requirements for infinite CMR are not available due to the inability to produce a transformer with a secondary resistance equal to zero and due to the finite impedances that exist in the cable and at the input of unit 12.

The result of these two considerations can be simply viewed in terms of voltage dividers. If transformer 22 had a secondary with a resistance of, for instance, 100 ohms and assuming $R_{in}$ of unit 12 to have a value 10K ohms, then a voltage divider is provided which would yield only 0.9901 volts at node 48 when 1.000 volts is available at node 38. Differential amplifier 30 would now see 0.9901 volts and 1.000 volts on its two inputs. The difference is 0.0099 volts, or −40dbv. In other words, with 1.0dbv of hum, a −40dbv amount of hum is impressed into the output of differential amplifier 30. The CMR is therefore equal to 40db.

In actualizable audio systems, this amount of hum would be extremely audible. This underscores how critical it is that exactly the same hum voltage be placed or mirrored onto each of the inputs of differential amplifier 30. One can easily appreciate the difficulty of achieving CMRs in the range of 100db, since the difference in voltage across the inputs would have to be less than 10 micro-volts for a common mode hum voltage of one volt.

In an attempt to improve the CMR in the output transformer situation pictured in FIG. 2, the voltage divider effect must be minimized. This can be accomplished by either increasing $R_{in}$ or decreasing the internal secondary impedance of transformer 22. For example, if transformer 22 had a secondary impedance decreased to 10 ohms and assuming $R_{in}$ was increased 100K ohms, the resulting CMR would be 80db, Therefore, the CMR qualities of any balanced output stage to represent the effect of a perfect output transformer can be qualitatively stated as follows: the differential input impedance looking into the transformer secondary or the signal pair of some other device must be as low as possible. The signal impedance between either of the two signal output lines and the common should be as high as possible. From these two statements, another corollary can be stated that has great importance. It has been found that the current flowing in the two lines of the output signal pair must be perfectly equal in magnitude and out-of-phase in order to achieve exactly equal signal values at the inputs to differential amplifier 30.

It is thus through the utilization of the first two principles plus this latter finding that the current flowing through each of the two lines of the output signal pair must be equal in magnitude and out-of-phase which governs the ability of the subject circuit to effectuate CMRs in excess of 100db.

Referring now to FIG. 3, in an electronic circuit which will assure that the above conditions apply, circuit 10 is provided with a balanced output which, in part, emulates the function of the aforementioned isolation transformer. In this circuit, an input signal $E_{in}$ at 60 is applied across a resistor 62 to a summing node 64 coupled to the inverting input of a high gain amplifier 66 having its non-inverting input coupled to ground as illustrated at 68. The output of amplifier 66 is applied to the inverting input of a differential summing amplifier 70 and to the non-inverting input of a differential summing amplifier 72. The output of these amplifiers is respectively coupled through resistors 74 and 76 to output nodes 44 and 46 as illustrated.

In order to provide for the first of the feedback loops, a differential summing amplifier 75 has its non-inverting input coupled to node 44, whereas its inverting input is coupled to node 46. The output of differential amplifier 75 is applied through resistor 80 to node 64. The purpose of this feedback circuit is to provide that the differential voltage at the output of the device is equal to the voltage at the input of the device.

The second feedback loop senses the current in each of the output lines of the circuit by virtue of the provision of a differential summing amplifier 82 coupled across shunt resistor 74 with the noted polarities; and differential summing amplifier 84 which is coupled across shunt resistor 76, again with the noted polarities. The outputs of these differential amplifiers are coupled to a further differential summing amplifier 86, with the polarities noted. The output of differential amplifier 86 is provided to high gain amplifier 88, the output of which is coupled to the non-inverting inputs of differential amplifiers 72 and 70, thereby to assure that the signals available at output nodes 44 and 46 have currents exactly equal in magnitude and opposite in phase. This assures that the noise signals applied to nodes 39 and 48 are exactly such as to be cancelled by differential amplifier 30.

In operation, the + and − signs used in the following discussions denote phase polarity. The presence of DC or AC as the input signal is unimportant from the standpoint of an operational model. Theoretically, circuit 10 responds identically to AC or DC. It should also be noted that the lumped gain represented in amplifiers 66 and 88 could also be spread out into some of the summing amplifiers 70, 72, 75, 82, 84 and 86 which are here assumed to be unity gain. Also, all operational inputs are assumed to be of high impedance, and all outputs of low impedance.

Assuming that $E_{in} = +5V$, and both output voltages are equal to 0V, with RG1 and RG2 both equal, then the voltage at the inverting input of amplifier 66 would be +2.5V. Since this is the input voltage to the inverting input of amplifier 66, and since the non-inverting input of this amplifier is at ground potential, then the output voltage of amplifier 66 at node 67 would be a very high negative voltage; for instance −100V. This voltage is then introduced to the inputs of amplifiers 70 and 72 with the input phase polarity noted.

Assuming that the output from amplifier 88 is 0V, then the output voltage from amplifier 70 would be +100V, and the output voltage from amplifier 72 would be −100V. Assuming no differential loading, the corresponding output voltage at the node 46 would be +100V, and that at node 44 would be about −100V.

Amplifier 75 then measures the difference between these two outputs and produces an output voltage of −200V. This is fed back to amplifier 66 at 50% reduction by RG1 and RG2. Since this feedback is negative, it reduces the voltage at node 64 from +2.5V down to about zero. The result is that with a high gain in amplifier 66, the inverting input of amplifier 66 is almost at ground potential, e.g. virtual ground, and the differential output voltage will always be equal to $E_{in}$.

To see how circuit 10 eliminates hum, assume that an external generator produces an output voltage, $E_{hum}$, of +1V which is coupled to node 44. Thus node 44 is at +1V, and L initially, all other nodes are at 0 Volts.

Since the output of amplifier 72 is at 0V, the voltage across resistor 76, RS2, is 1V, with node 44 positive relative to node 45. $E_{hum}$ is thus driving a current into the output associated with node 44 through resistor 76.

Amplifier 84 measures this voltage, and produces an output of opposite phase, e.g. −1V. The inputs to amplifier 86 are then at −1V from amplifier 84 and at 0V from the output of amplifier 82. The output from amplifier 86 is thus −1V.

Amplifier 88 then amplifies this −1V by very high gain and produces an output voltage of, for instance +100V at node 89. This voltage is now transferred through amplifiers 70 and 72 without a phase change to their outputs. Therefore, the second feedback system has raised the voltage at node 45 to oppose the voltage impressed by $E_{hum}$. Since this opposing voltage changes the direction of current flow through RS2, this creates a negative feedback system whereby the exact $E_{hum}$ voltage will be produced on both sides of RS2 thereby eliminating any current flow through the resistor.

During this process node 46 is also raised to the $E_{hum}$ +1V potential as well. Now, assuming that the unity gain through the amplifiers 70 and 72 was not perfectly equal, this +1V at node 46 would be slightly different.

Here, the first feedback system becomes operative. Since the input voltage is zero, the difference voltage between output nodes 44 and 46 must be zero. The first feedback loop has the ability to drive the outputs in opposite directions as was previously shown until the output signal difference matches the input voltage difference, in this case, zero. The first feedback loop system then perfectly adjusts the voltage at node 46 until it is exactly equal to the voltage at node 44, or the $E_{hum}$ voltage of +1V.

Thus, to perfectly cancel or reject an introduced hum voltage on one of the output lines, amplifier 88 raises the voltage perfectly on the other side of the corresponding shunt resistor to stop any current flow into that output line, in the process also raising the other output line to about the same voltage. The first feedback system simultaneously adjusts this other output line to perfectly match the $E_{hum}$ voltage on the first output line. It is the occurrence of these equal noise-induced voltages which, when applied to differential amplifier 30 result in the ground loop noise cancellation.

In summary, as to the circuit components, an input signal is amplified by a first high gain amplifier and is then applied to differently polarized inputs of two differential amplifiers which serve to provide the balanced output signals for the subject system. The outputs of these two differential amplifiers are themselves provided to a differential amplifier which provides an error signal comprising the difference in voltage between the two outputs. This difference in output voltage is summed with the input voltage such that the input voltage to the high gain amplifier is driven in such a manner to reduce the error signal. Upon so doing, the difference between the differential output voltage and the input voltage is driven to zero. This accounts for the equivalent of a very low impedance output for the circuit. Secondly, resistors are placed in the outputs of each of the aforementioned differential amplifiers so as to be able to sense the current in each of the output lines. These voltages are proportional to the currents themselves, both in phase and magnitude. These voltages are summed, with the resultant being an error signal which is amplified and added in phase to the non-inverting inputs of each differential amplifier making up the balanced output circuit. If the voltages corresponding to the currents are out-of-phase and equal, then adding them together produces a zero error voltage. If they are not equal and out-of-phase, then their addition produces a non-zero result which drives both of the output voltages in the same direction until the output currents are equal in magnitude and out-of-phase.

It will be appreciated that there are equivalent voltage and current measuring circuits for each feedback loop, with the form of the measurement in terms of voltage and current being a matter of design choice. For instance, the high gain amplifiers could be producing output currents rather than voltages. In this case, summing amplifiers 70 and 72 would be summing currents rather than voltages.

Having above indicated a preferred embodiment of the present invention, it will occur to those skilled in the art that modifications and alternatives can be practiced within the spirit of the invention. It is accordingly intended to define the scope of the invention only as indicated in the following claims.

I claim:

1. An electronic output transformer circuit adapted to be coupled to a balanced or unbalanced input stage of a remote unit comprising:
   means responsive to an input signal for providing an balanced output signal across balanced output lines including a high gain amplifier having said input signal coupled thereto and a differential output stage coupled to the output of said high gain amplifier, the output of said high gain amplifier being applied to respective output lines;
   first feedback circuit means coupled between said output lines and the input to said high gain amplifier for forcing the difference in amplitudes of the output signals at said balanced output lines to equal the amplitude of said input signal; and,
   second feedback circuit means coupled between said balanced output lines and the input to said differential output stage for maintaining the current in said balanced output lines equal and out-of-phase.

2. The electronic output transformer circuit of claim 1 wherein said first feedback circuit means includes:
   a differential summing amplifier having its inverting and non-inverting inputs coupled across said output lines; and,
   means for coupling the output of said differential summing amplifier to an input of said high gain amplifier.

3. The electronic output transformer of claim 2 wherein said first feedback circuit includes:
   a voltage dividing circuit;
   means for connecting the center of said voltage dividing circuit to said input of said high gain amplifier;
   means for coupling said input signal to one side of said voltage dividing circuit; and,
   means for coupling the output of said differential summing amplifier to the other side of said voltage dividing circuit.

4. The electronic output transformer of claim 1 wherein said second feedback circuit means includes:
   means including resistors in each of said output lines for detecting the magnitude and direction of current through respective output lines as a voltage drop across respective resistors;
   means for summing said voltage drops to provide an error signal;
   high gain amplifier means for amplifying said error signal; and,
   means coupled to said differential output stage for adding said amplified error signal to the output signals therefrom.

5. A system for eliminating extraneous ground loop noise from being present in the output of a remote unit having a pair of balanced or unbalanced inputs coupled to audio signals transmitted over a balanced line comprising:
   an electronic output transformer for transmitting said audio signals to said remote unit over said balanced line, said electronic transformer including negative feedback means for mirroring any ground loop induced extraneous signal at one output of said electronic transformer onto the other output of said electronic transformer such that the magnitude and phase of the voltage due to any extraneous signal at one output is equal to the corresponding voltage at the other output, whereby circuitry in said remote unit is permitted to cancel said extraneous signals from the output thereof, and whereby positive feedback circuits are avoided.

6. The system of claim 5 wherein said mirroring means includes a pair of negative feedback loops for establishing said equal magnitude and phased output voltages on each of said balanced lines, with said output lines being effectively isolated one from the other, whereby resistor and component matching is unnecessary.

7. The system of claim 5 wherein the CMR of said electronic output transformer exceeds 80db.

8. The system of claim 5 wherein the CMR of said electronic output transformer exceeds that achievable with a physical output transformer.

9. The system of claim 5 wherein said mirroring means includes:
   means responsive to an input signal for providing a balanced output signal across said balanced output lines, said means including a high gain amplifier having said input signal coupled thereto and a differential output stage coupled to the output of said high gain amplifier, the output of said high gain amplifier being applied to respective output lines;
   first feedback circuit means coupled between said output lines and the input to said high gain amplifier for forcing the difference in amplitude of the output signals at said balanced output lines to equal the amplitude of said input signal; and,
   second feedback circuit means coupled between said balanced output lines and the input to said differential output stage for forcing the current in said balanced output lines to be equal and out-of-phase.

10. A method of improving the CMR of an electronic output transformer to equal or exceed that of a physical output transformer so that extraneous ground loop induced signals will not be present in the audio output of a remote unit to which audio signals are transmitted, comprising the steps of:
   providing the electronic output transformer with a high gain input amplifier and a balanced output stage coupled thereto, said output stage having balanced outputs;

forcing the differential output voltage across the balanced outputs to equal the amplitude of the input signal to the transformer; and, forcing the output currents at the balanced outputs to be of equal magnitude and out-of-phase.

11. Apparatus for improving the CMR of an electronic output transformer to equal or exceed that of a physical output transformer, comprising:

an electronic output transformer adapted to be coupled to an input signal and having a high gain input amplifier and a balanced output stage coupled thereto, said output stage having balanced outputs;

means for forcing the differential output voltage across the balanced outputs to equal the amplitude of said input signal; and, means for forcing the output current at the balanced outputs to be of equal magnitude and out-of-phase.

* * * * *